(12) United States Patent
Salles et al.

(10) Patent No.: US 9,817,036 B2
(45) Date of Patent: Nov. 14, 2017

(54) HIGH BANDWIDTH CURRENT SENSOR AND METHOD THEREFOR

(71) Applicants: Alain Salles, Ramonville St Agne (FR); Kamel Abouda, Saint Lys (FR); Patrice Besse, Tournefeuille (FR)

(72) Inventors: Alain Salles, Ramonville St Agne (FR); Kamel Abouda, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 303 days.

(21) Appl. No.: 14/438,243

(22) PCT Filed: Nov. 6, 2012

(86) PCT No.: PCT/IB2012/002427
§ 371 (c)(1),
(2) Date: Apr. 24, 2015

(87) PCT Pub. No.: WO2014/072760
PCT Pub. Date: May 15, 2014

(65) Prior Publication Data
US 2015/0276815 A1    Oct. 1, 2015

(51) Int. Cl.
*G01R 15/18* (2006.01)
*G01R 19/28* (2006.01)
(52) U.S. Cl.
CPC ............ *G01R 15/18* (2013.01); *G01R 19/28* (2013.01)
(58) Field of Classification Search
CPC .................................. G01R 15/18; G01R 19/28
See application file for complete search history.

(56) References Cited

U.S. PATENT DOCUMENTS

| 4,528,502 A | 7/1985 | Rocha |
| 6,177,806 B1 * | 1/2001 | Burghartz ............ G01R 15/148 324/117 H |
| 6,608,361 B2 | 8/2003 | Chang et al. |
| 6,624,624 B1 | 9/2003 | Karrer et al. |
| 6,667,725 B1 | 12/2003 | Simons et al. |
| 6,781,359 B2 | 8/2004 | Stauth et al. |
| 7,253,497 B2 | 8/2007 | Bhatt et al. |
| 7,362,086 B2 | 4/2008 | Dupuis et al. |
| 7,622,910 B2 | 11/2009 | Kojori |
| 7,679,162 B2 | 3/2010 | Dupuis et al. |
| 7,990,132 B2 | 8/2011 | Dupuis et al. |

(Continued)

FOREIGN PATENT DOCUMENTS

| EP | 1666893 A1 | 6/2006 |
| WO | 2014125317 A1 | 8/2014 |

OTHER PUBLICATIONS

International Search Report and Written Opinion correlating to PCT/IB2012/002427 dated Jul. 25, 2013.

(Continued)

*Primary Examiner* — Daniel Miller (57) ABSTRACT

A current sensor comprises a current carrying trace located within a substrate; and a sensing trace located within the substrate proximate to the current carrying trace; wherein the sensing trace detects an electromagnetic force (emf) generated by magnetic flux inductively coupled from the current carrying trace for transmitting to a current sensing device.

14 Claims, 5 Drawing Sheets

(56) References Cited

U.S. PATENT DOCUMENTS

2004/0155644 A1    8/2004  Stauth et al.
2007/0139066 A1    6/2007  Dupuis et al.

OTHER PUBLICATIONS

Karrer Nicolas et al: "PCB Rogowski Coils for High di/dt Current Measurement", Power Electronics Specialists Conference, IEEE 31st Annual, Jun. 18-23, 2000, vol. 3, pp. 1296-1301.

Ward, D. A. et al: "Using Rogowski Coils for Transient Current Measurements", Engineering Science and Education Journal, Jun. 1993, vol. 2, Issue: 3, pp. 105-113.

Palmer Patrick R. et al: "Non-Invasive Measurement of Chip Currents in IGBT Modules", Power Electronics Specialists Conference, 28th Annual IEEE, Jun. 22-27, 1997, vol. 1, pp. 166-171.

Ray W. F.: "Rogowski Transducers for High Bandwidth High Current Measurement", Low Frequency Power Measurement and Analysis (Digest No. 1994/203), IEEE Colloquium, London, Nov. 2, 1994, pp. 10/1-10/6.

Xiao Chucheng et al: "An Overview of Integratable Current Sensor Technologies", Industry Applications Conference, 38th IAS Annual Meeting, Oct. 12-16, 2003, vol. 2, pp. 1251-1258.

Xu Jing et al: "Design of an Embedded Bi-Planar Coil-Based Integrated Current Sensor for Power Module Integration", Applied Power Electronics Conference and Exposition, APEC Twentieth Annual IEEE, Mar. 6-10, 2005, vol. 1, pp. 369-374.

Busatto Giovanni et al: "MAGFET Based Current Sensing for Power Integrated Circuit", Microelectronics Reliability, vol. 43, Issue 4, Apr. 2003, pp. 577-583.

Argueso M. et al: "Measurement of High Frequency Currents with a Rogowski Coil", Department of Electrical Engineering, E.P.S. Universidad Carlos III de Madrid, C/ Butarque 15, 28911 Legan'es, Madrid (Spain), pp. 1-5.

Schonau T. et al: "SQIF-Based DC SQUID Amplifier with Intrinsic Negative Feedback", Superconductor Science and Technology, IOPScience, webpage: http://iopscience.iop.org/0953-2048/25/1/015005, vol. 25, No. 1.

Rojas-Moreno Monica V. et al: "Study of an Inductive Sensor for Measuring High Frequency Current Pulses", Instrumentation and Measurement, IEEE Transactions, vol. 60, Issue: 5, Nov. 22, 2010, pp. 1893-1900.

\* cited by examiner

HIGH BANDWIDTH CURRENT SENSOR AND METHOD THEREFOR

FIELD OF THE INVENTION

The field of this invention relates to a method and apparatus for current sensing, and in particular for sensing of a high bandwidth alternating current (AC) within a substrate using magnetic coupling.

BACKGROUND OF THE INVENTION

In the field of integrated circuit (IC) devices, there is often a need to detect a current at a particular point within a circuit, for example to enable control of other parts of the circuit, say via a feedback control loop. One way of implementing a suitable current sensor is to connect a resistor in series with the current path and measure the voltage across the resistor, which is proportional to the current flowing though the circuit. The drawback with this type of current sensor is that it is generally high loss, due to the 'resistive' nature of the resistor being incorporated into the current path. A potential solution could be to reduce the resistance value of the resistor; however this has the knock-on effect of reducing the sensitivity of the measuring device in the current path. Further, this type of resistive current sensor is only applicable to direct current (DC) circuits.

Another option for measuring currents within a circuit could be to utilise magnetic coupling, for example in the form of a Rogowski coil. Generally, in this type of circuit, a coil of metal is wound around, or in close proximity to, a current carrying wire, for example. If the coil and current carrying wire are in close proximity with each other, they will act as coupled inductors. Therefore, any change in current within the current carrying wire will be detected by the coil of wire, whereby the signal induced within the coil will be proportional to the change in current within the current carrying wire. In this way, the change in current can be 'sensed' due, in part, to mutual inductance. This method of current sensing has the advantage that the sensor (coil) is not directly coupled to the current carrying wire. Therefore, there is a degree of isolation between the sensor and the current carrying wire, thereby limiting any disturbance to the current flowing through the current carrying wire.

The method of current sensing discussed above generally has high parasitic capacitance and inductance, due, in part, to a plurality of turns being required to increase the sensitivity of the Rogowski coil or sensing coil. The increased sensitivity is achieved at the expense of lower bandwidth. It is well known in the art that parasitic capacitance and inductance collectively form the reactance of an AC circuit, the imaginary part of impedance. Thus, sensing coils, such as Rogowski coils, are not generally suitable for high frequency current sensing applications.

SUMMARY OF THE INVENTION

The present invention provides a current sensor and method for detecting current within a substrate as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Examples of the invention provide a current sensor comprising a current carrying trace located within a substrate; and a sensing trace located within the substrate proximate to the current carrying trace; wherein the sensing trace detects an electromagnetic force (emf) generated by magnetic flux inductively coupled from the current carrying trace for transmitting to a current sensing device.

In examples of the invention, the term 'within', for example when referring to traces or similar, should be construed as encompassing traces to elements at or along a surface of a substrate.

In some examples, the current flowing within the current carrying trace may be an alternating current, such as a pulsed alternating current. In some examples, the current carrying trace and sensing trace may be formed of copper. In some examples, the detected emf may represent a voltage difference between respective ends of the sensing trace, generated by a magnetic flux flowing through a surface of the sensing trace. In some examples, the current sensor may comprise a plurality of sensing traces. In some examples, at least one of the sensing trace and current carrying trace is proximate to a surface or located on the surface of the substrate.

In some examples, the current sensor may comprise a first and second substrate, for example where the first substrate may comprise of silicon and the second substrate may comprise of silicon dioxide and for example where the current sensor may be located substantially within the second substrate. In some examples, the sensing trace may form an approximation of a loop. In some examples, the current sensor may comprise a further sensing trace operably coupled to a previous sensing trace by a metal via, for example where the further sensing trace and the metal via are located within the substrate proximate to the current carrying trace. In some examples, the further sensing trace may be located above the current carrying trace and the previous sensing trace may be located below the current carrying trace.

In some examples, the emf may be detected by the previous and further sensing traces being added together. In some examples, the previous and further sensing traces may form a substantially three dimensional loop within the substrate.

Figure 1:
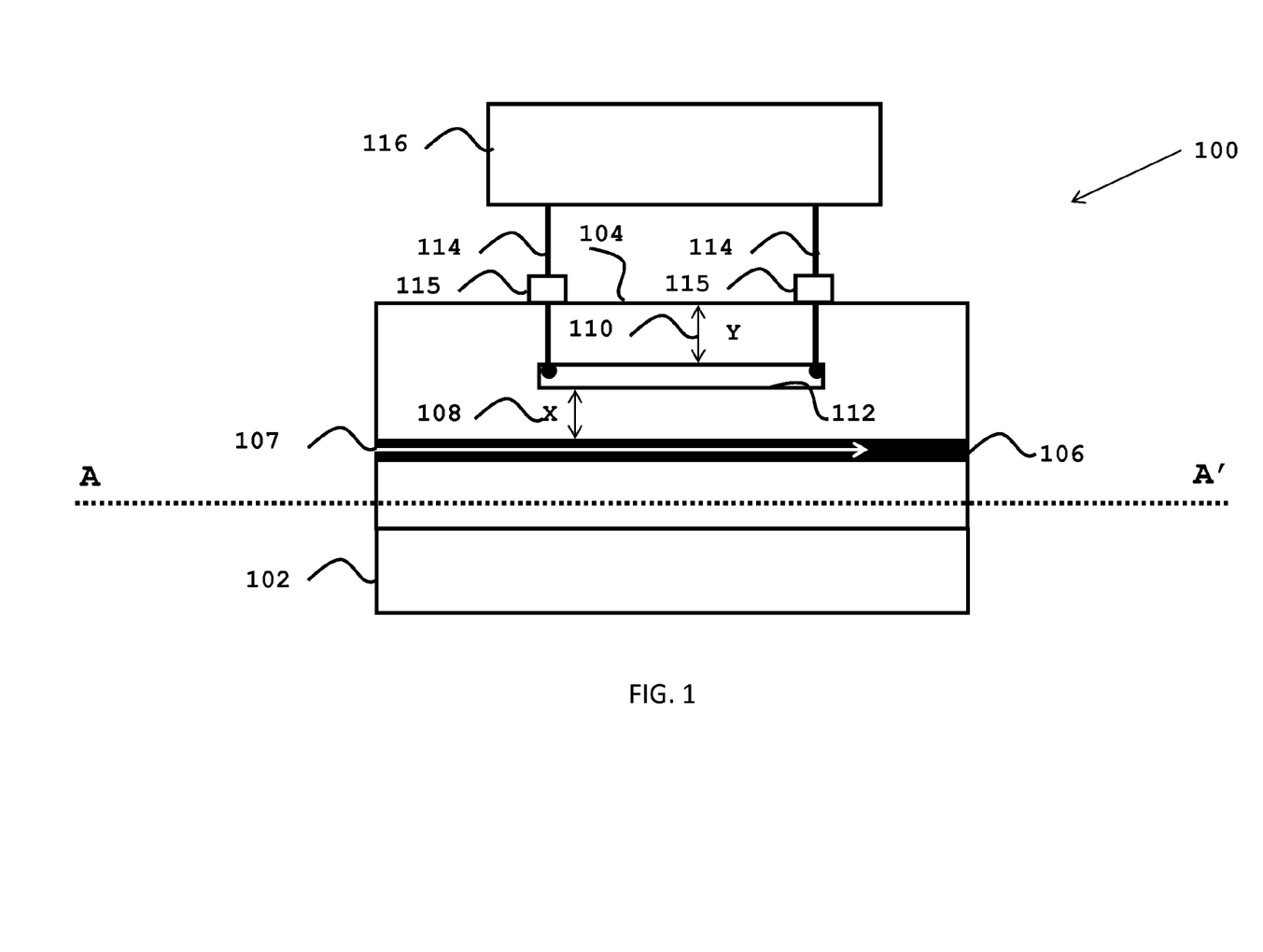
FIG. 1 shows schematically an example of a simplified figurative cross section of an example current sensor.

Examples of the invention provide a method of detecting current within a substrate comprising, detecting an electromagnetic force (emf) generated by magnetic flux inductively coupled from a current carrying trace to a sensor trace located within the substrate; and transmitting the emf to a sensing device Referring to FIG. 1, there is illustrated a simplified figurative cross section of an example current sensor 100 comprising, first substrate 102, second substrate 104, metal trace 106, current to be measured 107, sensing trace 112, electrical contacts 114, couplers 115 and sensing circuit 116. In this example, first substrate 102 is formed of Silicon (Si) and second substrate 104 is formed of an oxide layer, which in this example embodiment is a Silicon dioxide ($SiO_2$) layer. This oxide layer may be formed by thermal oxidation, sputtering, low pressure chemical vapour deposition, high pressure chemical vapour deposition, spin on glass, the like and combinations of the above. In other example embodiments, the current sensor 100 may be formed of only a single substrate or a plurality of substrates. Further, the first and second substrates may be interchanged, so that the main body of the invention is located within the Silicon layer (102), rather than within the oxide layer 104. It should also be noted that any semiconductor material or combination of materials, such as gallium arsenide, silicon germanium, silicon-on-insulator, silicon, mono-crystalline silicon, polycrystalline silicon, the like and combinations of the above can be used. Further, any suitable material able to form a passivation layer could be used to form second substrate 104, in this example.

In this example, metal trace 106 is located within oxide layer 104, a distance 'X' 108 from sensing trace 112. In this example, metal trace 106 and sensing trace 112 are formed of copper. In another example, metal trace 106 and sensing trace 112 are formed of aluminium or any other suitable metal, or combination of metals suitable for CMOS processing. In this example, distance 108 is the optimal distance between metal trace 106 and sensing trace 108 to facilitate optimal magnetic coupling. The optimal distance allows for the greatest amount of magnetic flux to be measured by sensing trace 112. It is noteworthy that any distance 'X' 108 between the metal trace 106 and sensing trace 112 may be used as long as a suitable sensing signal, based, at least in part, on measurement of magnetic flux, can be obtained. Decreasing the distance 'X' 108 between the metal trace 106 and the sensing trace 112 may increase the sensitivity of the current sensor 100, but may also have the knock-on effect of reducing the electrical isolation between the two traces 106 and 112. This may cause failure of the isolation layer and thereby electrically connect the two traces together, which is an undesirable effect. Sensing trace 112 is also located a distance 'Y' 110 from a surface of the second substrate 104. The distance 110 is, in part, dependent on the geometry of the second substrate 104, position of the metal trace 106 and position of the sensing trace 112.

In some examples, the distance 'Y' 110 may be negligible, leading to the sensing trace being proximate to a surface of the second substrate 104.

In this example, the generated magnetic flux from the current to be measured 107 located within metal trace 106 is sensed by sensing trace 112 and output to sensing circuit 116 via electrical contacts 114, which in this example embodiment are operably coupled to the sensing trace 112 and the sensing circuit 116 via couplers 115. The sensing circuit 116, in this example, is operably coupled in series with the sensing trace 112, and can comprise any suitable circuit for sensing injected current. The current to be measured 107 in this example comprises of a pulsed current. In other examples, the current to be measured 107 may comprise a periodic AC signal, quasi-AC signal, non periodic current signal, or any current signal, which alternates between at least one current level and another.

It should be noted that the length of the sensing trace 112 in relation to the current sensor is purely figurative.

Figure 2:
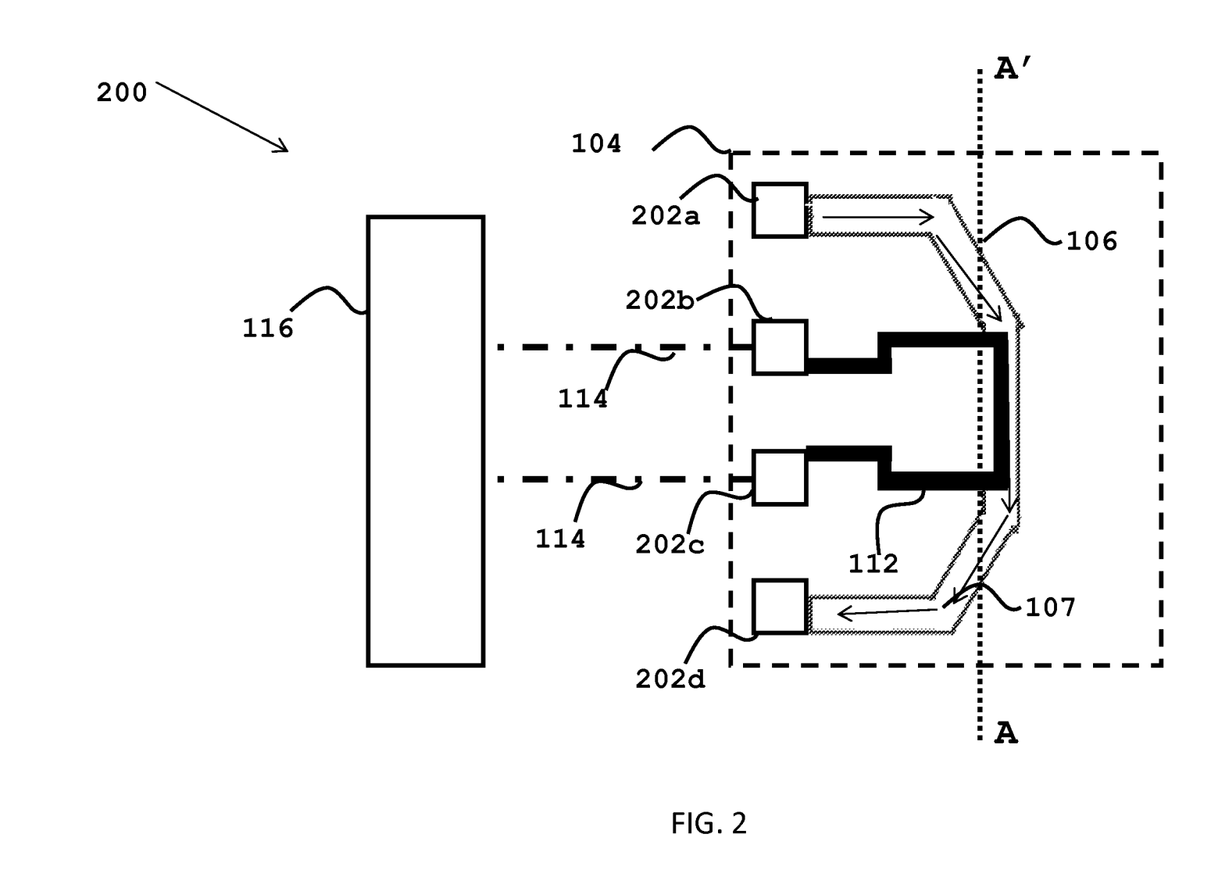
FIG. 2 illustrates an example top view of the current sensing circuit of FIG. 1.

Referring now to FIG. 2, there is illustrated a top view 200 of the current sensing circuit of FIG. 1. The top view 200 of the current sensing circuit of FIG. 1 comprises first substrate (not shown), second substrate 104, metal trace 106, sensing trace 112, couplers 202a, 202b, 202c, 202d, electrical contacts 114, current to be measured 107 and sensing circuit 116. The current to be measured 107, in this example, flows from coupler 202a to 202d via metal trace 106. The shape and implied scale of metal trace 106, and all other circuit elements are not to be construed as limiting, and are purely for illustrative purposes. Further, the amount of overlap, the length of the coupling region and thickness of the sensing trace illustrated in FIG. 2 are purely illustrative. In this example embodiment, metal trace 106 has a width of the order of 250 µm and a thickness of the order of 2.5 µm. These dimensions should not be construed as limiting. In other examples, the dimensions of the metal trace 106, along with other dimensions may be any suitable to the respective design.

As the current to be measured 107 flows through metal trace 106, it generates magnetic flux due to the rate of change of the, in this example, pulsed current, wherein the induced voltage (V2) in the sensing trace 112 is equal to:—

$$V2(t) = M \cdot \frac{di_1(t)}{dt}$$

where $i_1(t)$ is the current to be measured 107, and 'M' is the value of magnetic flux. In essence, the sensor trace 112 'sees' a voltage difference, or electromotive force (emf), between its ends, which in this example is between couplers 202b and 202c. This voltage difference is generated by the magnetic flux generated in the metal trace 106, which is at least partly coupled to sensing trace 112, while flowing through the sensor trace 112 loop.

In this example, the pulsed current has a pulse width of 100 ns, and operates at a frequency greater than 100 MHz. In other examples, the frequency band of the current pulse may be any frequency up to, say, 3 GHz. In further example embodiments, a derivative of the current pulse may be measured, and, as such, rise and fall times of the current pulse may be considered instead of pulse width.

In this example, the sensing trace 112 approximates the shape of a single rectangular loop. This is because, in this example, a square loop is beneficial as it is able to pass design rule checks DRC. However, in other examples, any polygon shaped loop may be used, ranging from a three-sided polygon (triangular) to an n-sided polygon (circular approximation). Further, in other example embodiments, different processes may be utilised to allow the formation of a circular loop or coil. In other examples, it may be beneficial to position sensing trace 112 so that it overlaps metal trace 106, in order to achieve efficient coupling between the two traces. Further, it may be beneficial for sensing trace 112 to be relatively thick, thereby reducing the resistance of the sensing trace, which, otherwise, could increase the impedance of the device, thereby reducing the available bandwidth (and consequently reducing frequency response).

In this example, the coupled magnetic flux generated in metal trace 106 is transmitted to sensing circuit 116 via electrical contacts 114. The sensing circuit 116 may, additionally, comprise an integrator, if a signal conditioner is to be used. In this example embodiment, the sensing circuit 116 therefore determines a derivative of the signal to be measured. Hence, an integrator circuit may be used if the real quantitative and qualitative characteristics of the signal to be measured are required.

Further, in this example, sensing trace 112 comprises a single loop, defined by coupler 202b, sensing trace 112 and coupler 202c, thereby reducing parasitic capacitance and inductance if compared to a multiple looped device. This is because, in the art, a multiple looped device generally takes a form of a tightly wound planar coil. The sensitivity of such a multiple looped device is greater than a single looped device. However, in an attempt to reduce surface area, due to the multiple coils, parasitic capacitance may be increased between the coils, thereby reducing the available bandwidth of the device. However, the disadvantage with a single looped device is that it will couple less magnetic flux compared to a multiple looped device, and therefore be less sensitive.

In other examples, the sensing trace 112 comprises a plurality of loops within the same plane. In further examples, the sensing trace 112 comprises 'n' number of loops within the same plane.

In other examples, the sensing trace 112 may reside below the metal trace 106.

In this example, since the current pulse to be measured 107 is relatively large, and the sensing trace 112 is located within the substrate, relatively close to the metal trace 106, there is no need for a plurality of loops to increase the sensitivity of the sensing coil 112. In fact, the positioning of the sensing trace 112 within the substrate proximate to the metal trace 106 allows the current sensor 100, 200 to operate at a higher bandwidth, as impedance within the device has been reduced when compared to multiple looped current sensors.

In another example, a plurality of sensing traces 112 may be utilised along the current path of the metal trace 106.

As discussed above, it is beneficial to reduce the number of loops of the sensing coil, as this will increase the bandwidth of the current sensor 100, 200. However, it is also beneficial to increase the sensitivity of the current sensor by employing more than one sensing loop, even though this may increase parasitic losses leading to a reduced bandwidth device. Therefore, in some examples, it a single looped device may be employed, with reduced parasitic capacitance and inductance, but with the benefits of a multiple looped device that is operable to increase current sensitivity.

Figure 3:
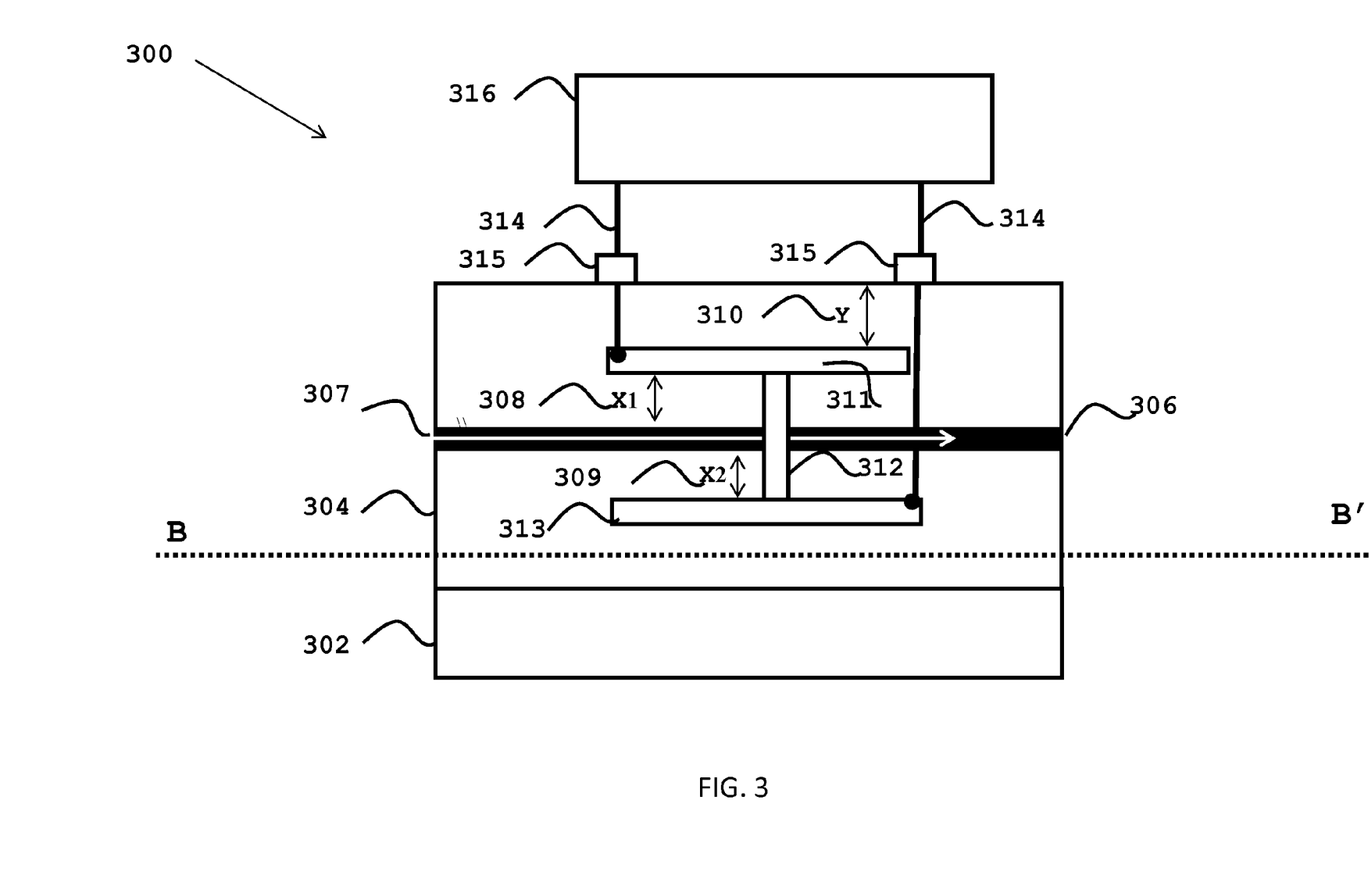
FIG. 3 illustrates an example simplified figurative cross section of the current sensing circuit of FIG. 1.

Referring to FIG. 3 there is illustrated a simplified figurative cross section of an example current sensor 300 of the current sensing circuit of FIG. 1, for example taken through points B and B' of subsequently illustrated FIG. 4. Example current sensor 300 comprises, first substrate 302, second substrate 304, metal trace 306, current to be measured 307, first sensing trace 311 located above metal trace 306, connecting 'via' 312, second sensing trace 313 located below metal trace 306, electrical contacts 314, couplers (figurative only) 315 and sensing circuit 316. In this example, first substrate 102 is formed of Silicon (Si) and second substrate 104 is formed of an oxide layer, which in this example is a Silicon dioxide (SiO$_2$) layer. This oxide layer may be formed by thermal oxidation, sputtering, low pressure chemical vapour deposition, high pressure chemical vapour deposition, spin on glass, or the like and/or combinations of the above. In another example, the current sensor 300 may be formed of only a single substrate or a plurality of substrates. Further, the first and second substrates may be interchanged, so that the main body of the invention is located within the Silicon layer (302), rather than within the oxide layer 304. It should also be noted that any semiconductor material or combination of materials, such as gallium arsenide, silicon germanium, silicon-on-insulator, silicon, mono-crystalline silicon, poly-crystalline silicon, or the like and/or combinations of the above could be used. Further, any suitable material able to form a passivation layer could be used to form second substrate 304.

In this example, metal trace 306 is located within oxide layer 304, a distance X1 308 from sensing trace 311. In this example, metal trace 306, first sensing trace 311, via 312 and second sensing trace 313 are formed of copper. In another example embodiment, metal trace 306, first sensing trace 311, via 312 and second sensing trace 313 may be formed of aluminium, or any other suitable metal, or combination of metals suitable for CMOS processing. In this example, distance 'X1' 308 is the optimal distance between metal trace 306 and first sensing trace 311 to facilitate optimal magnetic coupling. Selecting the optimal distance allows for the greatest amount of magnetic flux to be coupled and measured by first sensing trace 311.

It should be noted that any distance 'X1' 308 between the metal trace 306 and first sensing trace 311 can be used as long as a suitable sensing signal, based, in part, on measurement of magnetic flux, can be obtained. Decreasing the distance 'X1' 308 between the metal trace 106 and the first sensing trace 311 may increase the sensitivity of the current sensor 300, but may also have the knock-on effect of reducing the electrical isolation between the two traces 306 and 311. This can cause failure of the isolation layer and thereby electrically connect the two traces together, which is an undesirable effect. First sensing trace 311 is operably coupled to second sensing trace 313 by metal via 312. In this example embodiment, all three constituent parts of the sensing trace, 311, 312, and 313 are formed of the same metal. In other embodiments, each constituent part may be formed of any metal, or combination of metal, disclosed above. In this example, distance X2 309 is substantially the same as distance 'X1' 308. In other examples, distance 'X1' 308 and distance 'X2' 309 are not equal due, in this example, to the possibility of using a different combination of metals for each constituent part of sensing trace 311, 312 and 313. In this example, metal via 312 operably couples sensing traces 311 and 313 together. This has the effect of adding the EMF generated in first sensing trace 311 and second sensing trace 313 together. In this example, this may increase the sensitivity of the sensing circuit, as two sensing traces 311, 313 are utilised. The sum of the EMF generated between sensing trace 311 and 313 increases the sensitivity of the current sensor 300 when compared to a single looped device discussed above.

It is noteworthy that, in this example, the first sensing trace 311 and second sensing trace 313 are not discrete elements. These two elements do not form a differential sensing circuit. Both first sensing trace 311 and second sensing trace 313 are looped in the same direction with respect to each other. Sensing trace 311 is also located a distance 'Y' 310 from a surface of the second substrate 304. The distance 310 is, in part, dependent on the geometry of the second substrate 104, position of the metal trace 306 and position of the sensing trace 312. A similar dimension is applicable to second sensing trace 312, however in order to simplify FIG. 3, description and labelling of this feature has not been included.

In some embodiments, the distance 'Y' 310 may be negligible, leading to the sensing trace being proximate to a surface of the second substrate 304.

Figure 4:
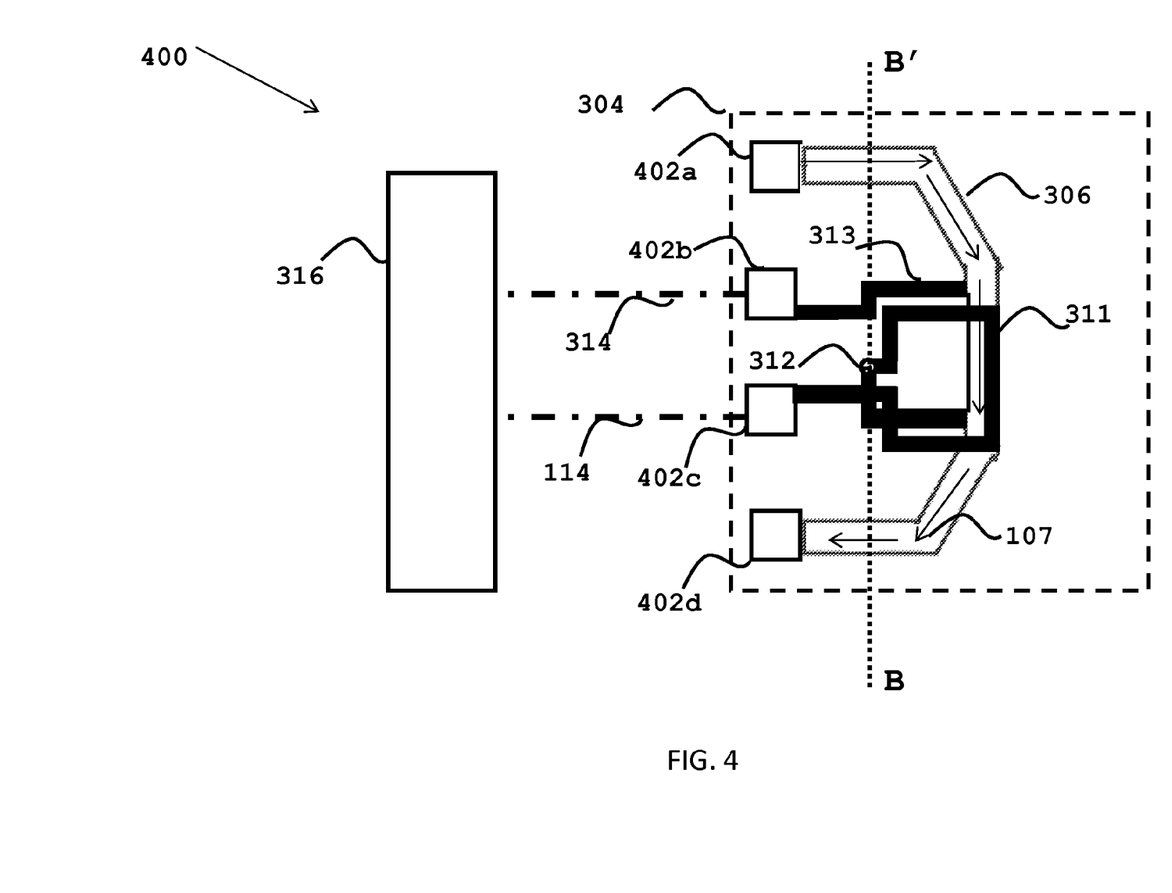
FIG. 4 illustrates an example top view of the current sensing circuit of FIG. 3.

Referring now to FIG. 4, there is illustrated a top view 400 of the current sensing circuit of FIG. 3. The current sensing circuit comprises first substrate (not shown), second substrate 304, metal trace 306, current to be measured 307, first sensing trace 311 located above metal trace 306, connecting 'via' 312, second sensing trace 313 located below metal trace 306, couplers 402a, 402b, 402c, 202d, electrical contacts 314 and sensing circuit 316. The current to be measured 307, in this example, flows from coupler 402a to 402d via metal trace 306. The shape and implied scale of metal trace 306 and all other circuit elements are not to be construed as limiting, and are purely for illustrative purposes. In this example, metal trace 306 has a width of the order of 250 μm and a thickness of the order of 2.5 μm.

In this example, any magnetic flux generated by the current to be measured 107, in this example a pulsed current, is coupled by first sensing trace 311 and second sensing trace 313. The metal via 312 operably couples the two sensing traces together, thereby having the effect of adding the generated EMF of two sensing traces 311 and 313. This has the effect of increasing the sensitivity of the current sensor 400, as sensing trace 311 and 313 are operable to 'sense' coupled magnetic flux from above and below metal trace 306.

As discussed in relation to FIG. 3, the two sensing traces 311 and 313 are displaced from the metal trace 306. This has the effect of minimising parasitic capacitance between the two sensing traces 311 and 313. Further, the two sensing traces 311 and 313 are offset from each other, minimising metal overlap between the two sensing traces 311 and 313, further reducing parasitic capacitance between layers.

In this example, the sensing traces 311 and 313 are looped in the same direction with respect to each other. Utilising the space within the substrate 304, the two sensing traces 311 and 313 are separated and offset with respect to each other to minimise parasitic capacitance, allowing the current sensor 400 to operate at a high bandwidth, while still being able to couple magnetic flux from below and above the metal trace 306, thereby increasing the sensitivity of the current sensor 400.

Spacing the two sensing traces 311 and 313 throughout the substrate, forming a three dimensional sensor, reduces parasitic capacitance and increases sensitivity of the sensor. Generally, in order to reduce parasitic capacitance in a planar device in the art, the spacing between the loops would be increased, creating a loosely wound coil. However this would take up a considerable amount of surface area. One benefit of this may be that it is able to displace the loops within the substrate, thereby reducing parasitic capacitance between the loops, but maintaining sensitivity.

Hence, the position of the two sensing traces 311 and 313, in this example, may allow the current sensor 400 to benefit from high bandwidth, reduced parasitic capacitance, and high sensitivity, dual sensing traces above and below the metal trace 306, to be realised.

In some examples, the current sensor 400 may comprise more than two sensing traces distributed within a substrate. In other examples, at least one sensing trace 311, 313 may be at a surface of a substrate. In other example embodiments, the two sensing traces 311, 313 may be regarded as a 'stack' of coils. Where the stack forms a two turns coil in three dimensions within the substrate, minimising parasitic capacitance between each coil turn. In other examples, the stack may comprise more than two sensing traces.

In some examples, the overlap and offset amount between sensing traces may be different. In order to clarify, offset is the distance between a stack of sensing traces, where zero offset would lead to both sensing traces being roughly parallel to each other. Separation/distribution refers to the distance between each sensing trace within a stack, for example.

The position of the metal via 312 should not be construed as limiting. The metal via 312 may take any position within the substrate(s) as long as there is suitable coupling between the sensing traces of a given stack. Therefore in some example embodiments, the metal via 312 may be magnetically coupled to a plurality of sensing traces with a stack(s). Further, the shape, starting and ending points of the metal trace, sensing traces should not be seen as limiting. In some examples, the current sensor 400 may comprise a plurality of stacks located within a substrate(s).

Figure 5:
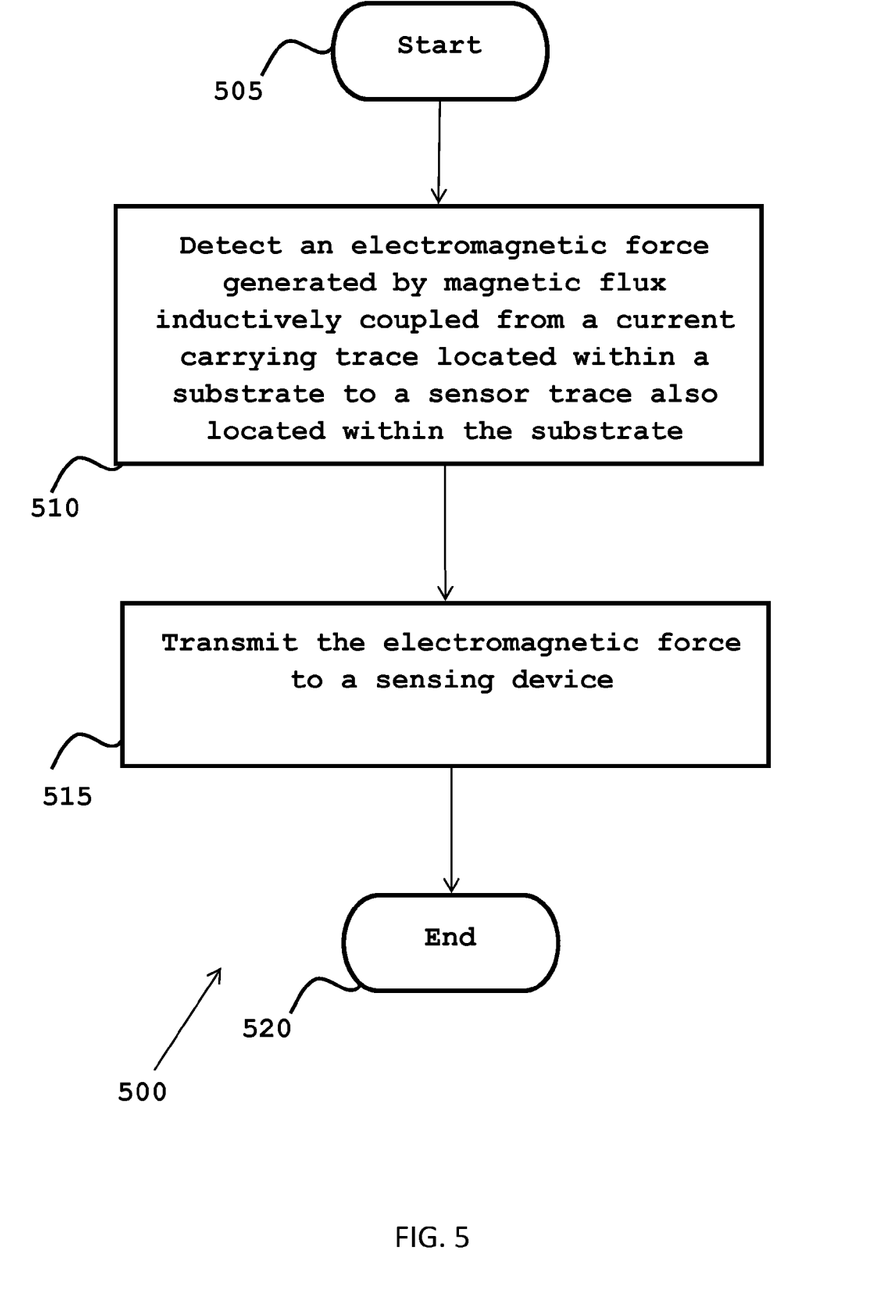
FIG. 5 illustrates an example flowchart for detecting current within a substrate.

Referring to FIG. 5, there is illustrated a simplified flowchart 500 of an example of a method of detecting current within a substrate. The method starts at 505, and moves on to 510 where an emf generated by magnetic flux is detected, where the magnetic flux is inductively coupled from a current carrying trace located within a substrate to a sensor trace also located within the substrate. Next, at 515, the detected emf is transmitted to a sensing device. The method then ends, at 520.

In some examples, the semiconductor substrate described herein can be any semiconductor material or combinations of materials, such as gallium arsenide, silicon germanium, silicon-on-insulator (SOI), silicon, monocrystalline silicon, or the like, and/or combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Furthermore, for example, positioning, size and shape of components are merely illustrative and could be modified to achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A current sensor comprising,
a current carrying trace located within a first metal layer of the substrate; and
a first sensing trace located within a second metal layer of the substrate proximate to the current carrying trace;
a second sensing trace located within a third metal layer of the substrate proximate to the current carrying trace, wherein
the first metal layer is between the second metal layer and the third metal layer,
the first sensing trace is looped in the same direction as the first sensing trace, and
a first end of the first sensing trace is connected to a first end of the second sensing trace with a via between the second and third metal layers of the substrate;
a sensing circuit, coupled to a second end of the first sensing trace and a second end of the second sensing trace, the sensing circuit configured to detect an electromagnetic force (emf) generated by magnetic flux inductively coupled from the current carrying trace to the first and second sensing traces.

2. The current sensor of claim 1, wherein the current flowing within the current carrying trace is an alternating current.

3. The current sensor of claim 2, wherein the alternating current is a pulsed alternating current.

4. The current sensor of claim 1, wherein the current carrying trace and the first and second sensing traces are formed of copper.

5. The current sensor of claim 1, wherein the detected emf represents a voltage difference between respective first ends of the first and second sensing traces, generated by a magnetic flux flowing through a surface of the sensing trace.

6. The current sensor of claim 1, wherein at least one of the first and second sensing traces and current carrying trace is proximate to a surface or located on the surface of the substrate.

7. The current sensor of claim 1, wherein the current sensor comprises a first and second substrate.

8. The current sensor of claim 7, wherein the first substrate comprises of silicon and the second substrate comprises silicon dioxide.

9. The current sensor of claim 8, wherein the second substrate comprises any insulation material compatible with CMOS processing.

10. The current sensor of claim 9, wherein the current sensor is located substantially within the second substrate.

11. The current sensor of claim 1, wherein the first and second sensing traces each forms an approximation of a loop.

12. The current sensor of claim 1, wherein the emf detected by the previous and further sensing traces is added together.

13. The current sensor of claim 1, wherein the previous and further sensing traces form a substantially three dimensional loop within the substrate.

14. A method of detecting current within a substrate comprising:
detecting an electromagnetic force (emf) generated by magnetic flux inductively coupled from a current carrying trace to a first sensor trace and a second sensor trace located within the substrate, wherein the first sensor trace is contained within a first metal layer of the substrate, the second sensor trace is contained with a second metal layer of the substrate and the current carrying trace is contained with a third metal layer of the substrate, wherein the third metal layer is between the first and second metal layers; and
transmitting the emf to a sensing device.

* * * * *